(12) United States Patent
Nguyen

(10) Patent No.: US 6,572,707 B1
(45) Date of Patent: Jun. 3, 2003

(54) VAPORIZER FOR SENSITIVE PRECURSORS

(75) Inventor: Tue Nguyen, Fremont, CA (US)

(73) Assignee: Simplus Systems Corporation, Fremont, CA (US)

( * ) Notice: Subject to any disclaimer, the term of this patent is extended or adjusted under 35 U.S.C. 154(b) by 0 days.

(21) Appl. No.: 09/594,887

(22) Filed: Jun. 14, 2000

(51) Int. Cl.$^7$ .............................................. C23C 16/00
(52) U.S. Cl. ......................... 118/726; 392/399; 122/40
(58) Field of Search ......................... 118/726; 392/399, 392/394; 122/40

(56) References Cited

U.S. PATENT DOCUMENTS

| | | |
|---|---|---|
| 5,204,314 A | 4/1993 | Kirlin et al. |
| 5,421,895 A | 6/1995 | Tsubouchi et al. |
| 5,536,323 A | 7/1996 | Kirlin et al. |
| 5,547,708 A | 8/1996 | Asaba et al. |
| 5,553,188 A | 9/1996 | Ewing et al. |

*Primary Examiner*—Thi Dang

(57) ABSTRACT

A vaporizer is provided for vaporizing sensitive liquid precursors in semiconductor processing applications. The vaporizer uses high flow conductance with large flow area to avoid precursor decomposition. The vaporizer also uses efficient heat conduction to avoid local cold spots due to the heat loss because of the transformation from the liquid to gas phase. The vaporizer convex surface configuration also allow a more uniform distribution of the vaporized liquid precursor. In some aspects of the invention, the vaporizer distributes the precursor to a larger area, thus eliminating the need for a showerhead.

18 Claims, 5 Drawing Sheets

VAPORIZER FOR SENSITIVE PRECURSORS

FIELD OF THE INVENTION

The present invention relates generally to apparatus for processing of a semiconductor wafer, and more particularly to a system to vaporizing sensitive liquid precursors.

BACKGROUND OF THE INVENTION

Conventional chemical vapor deposition (CVD) processes use vapor precursors for the deposition of thin films on an IC substrate. To broaden the processes, more and more liquid and solid precursors have been used, especially in the area of metal-organic chemical vapor deposition (MOCVD). To perform this task, a liquid precursor is typically turned to vapor, and the vapor is then decomposed on the substrate. A solid precursor must often be dissolved into a solvent to form a liquid precursor. Then, the liquid precursor needs to be converted into vapor phase before introduction into the deposition zone.

Basic components of a liquid precursor vaporization system is the liquid delivery system and the vaporizer. The liquid delivery system carries the liquid precursor from the liquid container to the vaporizer. The vaporizer converts the liquid precursor into vapor form before deliver on the substrate. A carrier gas is normally used in the vaporizer to carry the precursor vapor to the substrate. In some applications, a gas precursor could take place of the carrier gas, performing the carrying function together with the precursor function.

FIG. 1 shows a prior art vaporizer. The vaporizer includes a vaporization chamber 12 with a heater means 10 to bring the vaporization chamber to a vaporization temperature. The liquid precursor enters the vaporization chamber at liquid input 18. A valve 40 is optional, used for shut off the liquid flow. The liquid input sometimes extends into the vaporization chamber 20 to increase the vaporization efficiency. Another input 16 is for carrier gas with an optional valve 41 for shut off. The carrier gas carries the vaporized liquid to the output 14. The carrier gas function is essential in providing the vaporized precursor to the output. Without the carrier gas, the vaporized liquid flow is small, leading to the condensation of the liquid precursor inside the vaporization chamber.

FIG. 2 shows a prior art liquid delivery system. The liquid is stored in the container 40, and is pushed out to the metering device 30. The liquid continues to travel in the line 18 to the vaporizer 12 through valve 40. The tip of the liquid line 20 is inside the vaporizer 12. Carrier gas flows from the line 16 to the vaporizer 12 though valve 41. Heater 10 heats the vaporizer to a vaporization temperature. The major disadvantage of this delivery system is the reliability of the liquid delivery line. A small line is desirable for small flow, but too easily clogged. Also the proximity of the heat source, in the case of heat-sensitive precursor, could cause precursor degradation.

A related problem is in the delivery of the precursor to the vaporization chamber. To control the flow of liquid precursor, the liquid delivery input port to the vaporization chamber is made small. Large input ports, or small ports under high pressure, introduce too much precursor so that the vaporization process is inefficient. However, small ports used at relatively low pressures have a tendency to fill with decomposing precursor, and eventually clog. This is due to the unstable nature of most precursors and the proximity of heat source used to vaporize the precursor. The system must be shut down, and the decomposed and partially decomposed material removed from the input port, before the vaporization process can continue.

Other problem concerns the distribution pattern of liquid precursor to the vaporization chamber. Small ports at low pressure will form large droplet into the vaporization surface. It is well known to use piezoelectric atomizer to break the liquid precursor into finer droplets at the input section of a vaporization chamber. However, there is still a tendency for the liquid precursor port to clog due to relatively narrow opening and the proximity of heat. Pressure type atomizers are also well known, to break a liquid into droplets by pushing the liquid through an opening, creating a spray. To compensate for the high pressure of the liquid, the spray opening is very small. In this manner an efficient amount of precursor is delivered. Despite the high pressure, the very small opening has a tendency to clog in the heated vaporization chamber environment.

To increase the efficiency of the heat transfer to the liquid precursor, some conventional vaporizers use large extended surfaces, or a plurality of surfaces. While these surfaces do provide heat to vaporize liquid reagents, they are not necessarily efficient, as the heating surfaces extend in only two dimensions. The surface area can be increased by roughing the surface or minimizing the through passages through the plate. Simply increasing the surface area, however, does not necessarily increase the rate of flow of vaporized precursor. A trade-off is generally made between heated surface area and high flow rates of vaporized precursor. That is, conventional heated surface areas may block vapor flow, preventing a high flow rate. High pressure on the input side of the vaporizer creates a high pressure differential from the input to the output. Large inlet pressures may also cause condensation of the vapor. Eventually, condensed liquid blocks the vaporizer output. Alternately, the heated surface area can be reduced to increase the vapor flow conductance. However, when too little heated surface is provided, insufficient liquid precursor is vaporized, and the liquid precursor will collect in the vaporizer and eventually block the output. The above-described trade-off can also be considered an issue of deposition rates vs. efficient use of precursor.

Asaba et al. (U.S. Pat. No. 5,547,708) uses a series of flat plates with perforations as the vaporizing heating element, together with a piezoelectric device to atomize the liquid. Tsubouchi et al. (U.S. Pat. No. 5,421,895) discloses a heated plate and piezoelectric atomizer. A low pressure differential is created, but the heated surface area is small. Ewing (U.S. Pat. No. 5,553,188) discloses a plurality of thin flat heated disks to provide a large heated surface area, but liquid must move along the plates through capillary action. Precursor on heated plates for an extended period of time often solidifies to clog the system. Alternately, the system must be kept running at high liquid flow rates, which is costly and inefficient.

Kirlin et al. (U.S. Pat. Nos. 5,204,314, 5,536,323) disclose a vaporizer having a vaporization matrix to vaporize a liquid precursor. This so-called matrix is typically a flat mesh, grid, or screen. In some aspects of the invention the screen is a cylinder wrapped around an area substantially devoid of any structure. The two-dimensional matrix has relatively small pores to increase the heated surface area. Therefore, the vaporizer works best at low flow rates, for example, 0.2 milliliters (ml) per minute for low-volatility liquids. A porous vaporization element adjacent the vaporization chamber walls to accept a liquid reagent is also disclosed, in order to heat the liquid to vaporization temperature.

One major problem with the prior art vaporizers is low conductance. For sensitive precursors such as MOCVD precursors, the low conductance or small passage of precursor will lead to decomposition and then clogging. With small pores like the vaporizer disclosed by Kirlin et al., even at low flow rate, the system is still clogged after a certain period of time. Another major problem is the low heat conduction to the heated surfaces. When the liquid converts to vapor, it requires an extra amount of energy, called latent heat, for the liquid-gas phase transformation. Therefore efficient heat transfer is essential to avoid cold spot, leading to the condensation and eventually decomposition and clogging.

With small pores like the vaporizer disclosed by Kirlin et al., the heat conduction is poor.

A relate solution for avoiding clogging in the delivery line is disclosed in co-pending patent application entitled "Liquid delivery system emulsifior", invented by Tue Nguyen. A system of parallel vaporization chambers was presented in co-pending patent application entitled "Liquid precursor vaporization system using emulsifior delivery", invented by Tue Nguyen.

It would be advantageous if a vaporizer has high flow conductance for sensitive precursors.

It would be advantageous if a vaporizer has high heat conductance for sensitive precursors.

SUMMARY OF THE INVENTION

Accordingly, a vaporizer for vaporizing sensitive liquid precursors in semiconductor processing applications is provided. The vaporizer has multiple through holes larger than $\frac{1}{64}$", thus offering high flow conductance. The vaporizer is a solid block of high thermal conductance material, with the through holes separation farther than $\frac{1}{8}$" apart, thus offering high thermal conductance. The vaporizer has a cavity at the top surface to accept the liquid precursor. The cavity surface is convex with the high surface is under the liquid nozzle to ensure that the liquid will drip away from the center, thus allowing a more uniform precursor distribution.

The vaporizer for sensitive precursors comprises:

- a solid block of good thermal conductance material for efficient heat transfer, the solid block having a top surface, a bottom surface and a side surface with a plurality of through holes going from the top surface to the bottom surface;
- the through hole diameter being larger than $\frac{1}{64}$ of an inch for preventing clogging due to the decomposition of the precursor;
- the through hole separation being farther than $\frac{1}{8}$ of an inch for allowing sufficient heat transfer to the through hole walls;
- the top surface of the solid block is recessed inward leaving a thick wall at the side surface of the solid block to form a cavity, the recessed top surface of the cavity being convex toward the liquid precursor inlet to allow the liquid precursor to drip toward the side wall of the cavity for a more uniform distribution of the vaporized liquid precursor;
- a cap plate to cap the cavity;
- a plurality of input ports;
- a heater means for heating the solid block from the side surface; whereby the liquid precursor enters through the input ports to the cavity and travels through the through holes while receiving heat by contacting with the through hole walls, and the vaporized liquid precursor exits at the ends of the through holes at the bottom surface of the solid block.

In some aspect of the invention, the input port accepts the emulsified liquid precursor. The emulsified liquid port helps reducing clogging at the liquid delivery line. In some aspect of the invention, the vaporizer further comprises an atomizer such as an ultrasonic atomizer for atomizing the liquid precursor before vaporizing. The atomizer helps reducing the liquid droplet size for better vaporizing, thus increase the efficiency of the vaporizer.

In some aspect of the invention, the input ports comprises a plurality of carrier gas inlets in addition to a plurality of liquid inlets. In the case of multiple liquid inlets, the vaporizer top surface is tilted upward toward each liquid inlet to allow the dripping down of the liquid, thus increase the distribution of the liquid precursor.

In some aspect of the invention, the vaporizer further comprises a showerhead for better distribution of the vaporized precursor.

In some aspect of the invention, the cavity size is larger than 1 inch.

In some aspect of the invention, the vaporizer further comprises multiple solid blocks operatively connected to each other to extend the length of the through holes for better heat transfer to the liquid precursor. The amount of heat transfer is proportional to the length of the through holes, therefore by extending the through holes, more heat transfer will bring to the precursor, thus increase the liquid flow that can be vaporized.

In some aspect of the invention, the through holes are at an angle so that the solid block is optical dense when looking from the top surface toward the bottom surface. The heat transfer occurs when the liquid hits the wall, therefore an optical dense vaporizer will ensure that the liquid will hit the wall at least once before leaving the vaporizer.

In some aspect of the invention, the solid block has a cylinder shape, whereby the area covered by the through holes distribution are the same at the top surface and at the bottom surface of the solid block. In some aspect of the invention, the solid block has a cone shape, whereby the area covered by the through holes distribution are the larger at the bottom surface than at the top surface of the solid block.

In some aspect of the invention, the vaporizer comprises multiple cone shape solid blocks, and each successive block is larger than the previous one, whereby the precursor distribution covers a much larger area. In some aspect of the invention, the last block is large enough to cover the whole area of the workpiece, eliminating the need for a showerhead distribution.

In some aspect of the invention, the vaporizer further comprises a precursor delivery emulsifior to mix a gas with a liquid in a ratio greater, or equal to, one to one. The vaporizer also has a temperature means to adjust the temperature of the emulsifior, whereby the mixing process is conditioned for maximum control.

In some aspect of the invention, the vaporization chamber is heated to a first temperature, and in which the emulsifier is heated to a second temperature less than the first temperature, whereby the second temperature is low enough to prevent clogging.

DETAIL DESCRIPTION OF THE PREFERRED EMBODIMENT

Figure 1:
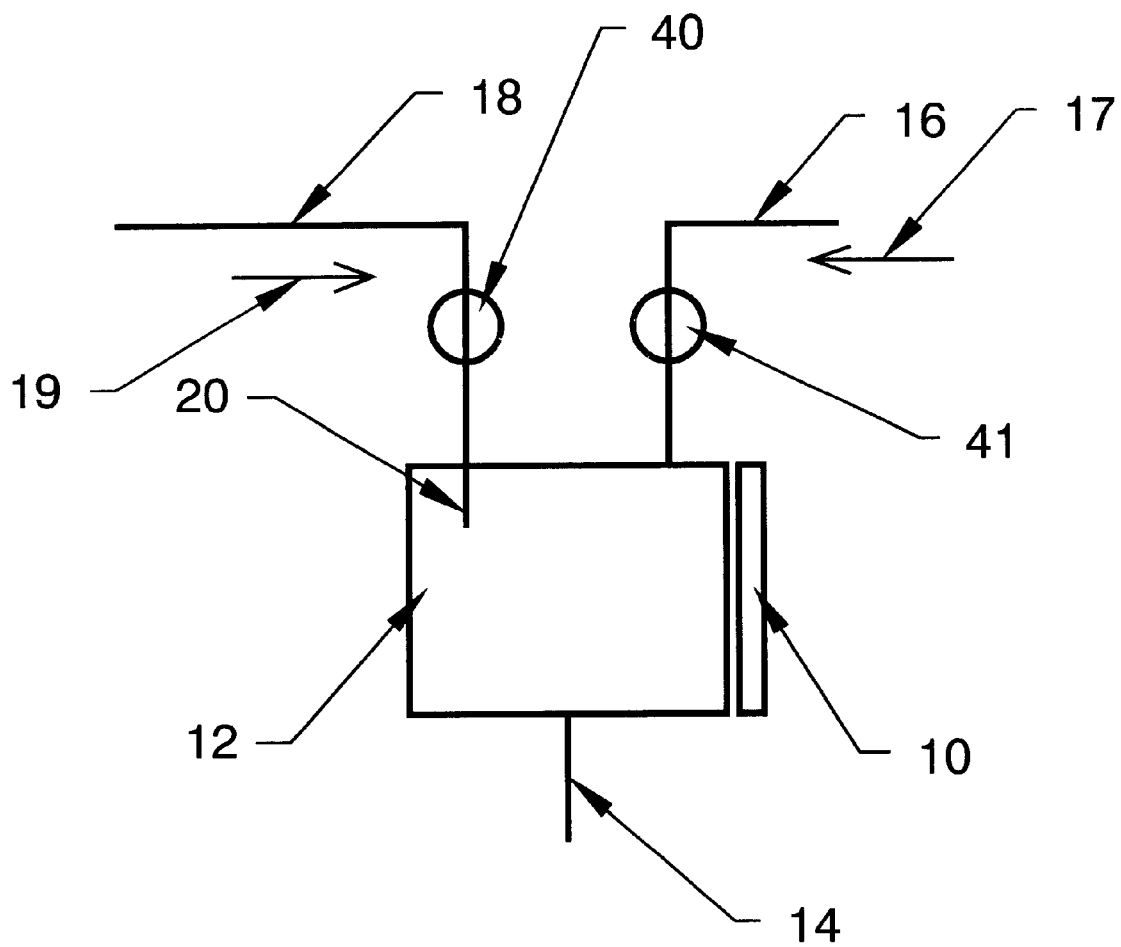
FIG. 1 shows a prior art vaporizer.
Figure 2:
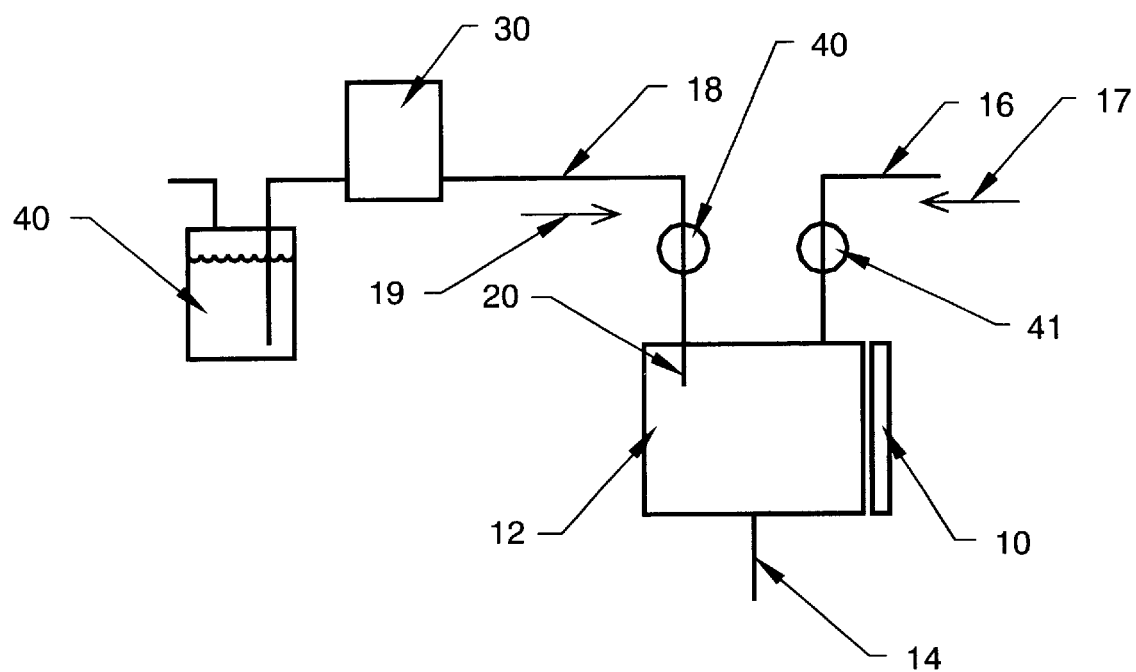
FIG. 2 shows a prior art liquid delivery system.
Figure 3:
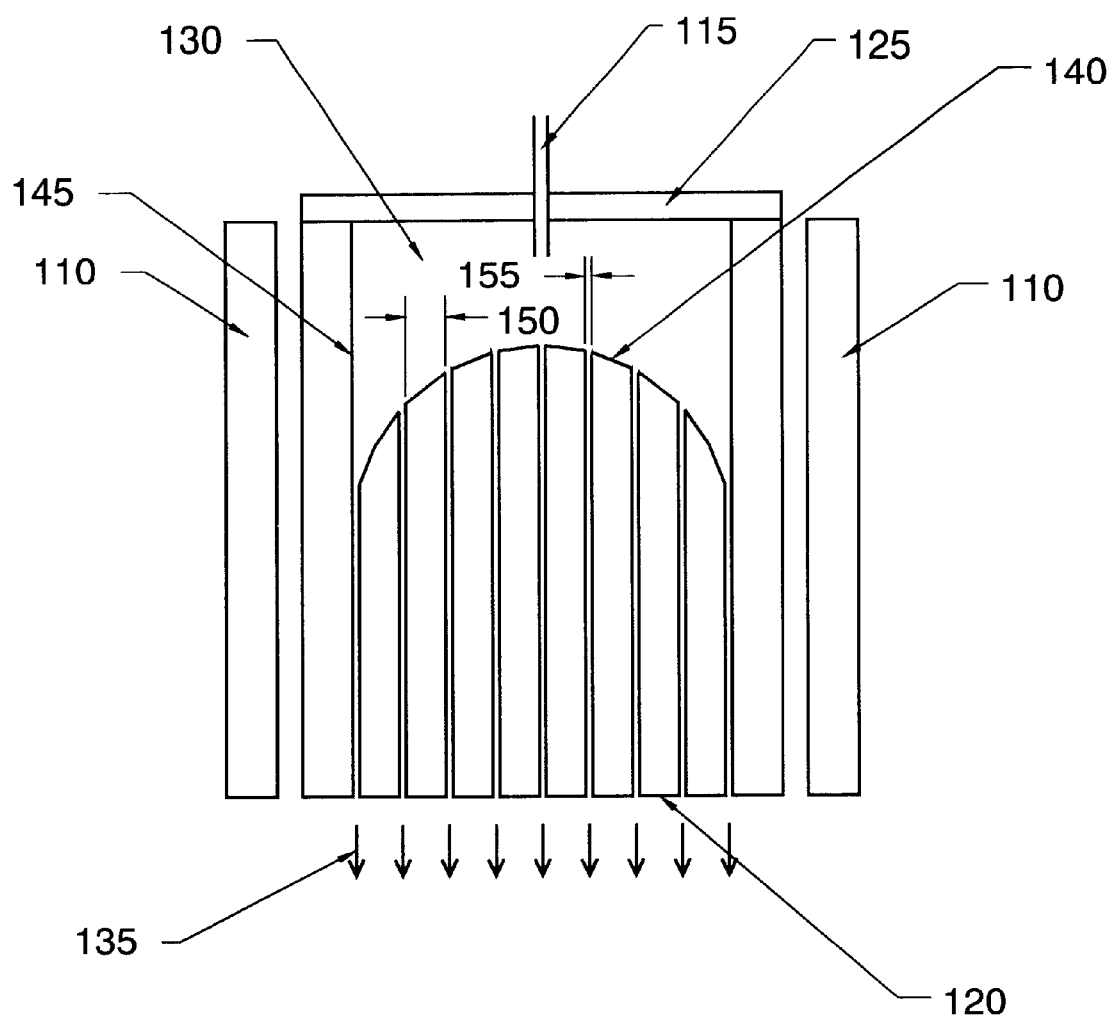
FIG. 3 shows the present invention vaporizer.

FIG. 3 shows the present invention vaporizer for sensitive precursors. The vaporizer is made of a solid block of good thermal conductivity for better head transfer. The solid block has a top surface 140, a bottom surface 120 and a side surface 145. The top surface 140 is recessed inward to form a cavity 130 leaving a thick wall for good heat retainer. The cavity is capped by a cap plate 125 to seal the cavity volume. The vaporizer has a plurality of inlets for precursor input. In FIG. 3, the inlet 115 is positioned at the cap plate, but the inlets could be in the solid block entering to the cavity. The vaporizer has a plurality of holes going from the top surface to the bottom surface. These holes have large enough diameter 155 to provide high flow conductance. The hole separation distance 150 is also large enough to provide enough heat to the hole walls for heat transfer to the precursor. The heater 110 heats the vaporizer to a vaporizing temperature for vaporizing the precursor. The precursor leave the vaporizer in a large area 135 than entering 115. The top surface 140 is convex toward the precursor inlet 115 for a better precursor distribution. The present invention vaporizer is suitable for sensitive precursors, especially precursors for metal organic chemical vapor deposition (MOCVD). Since the vaporizer temperature is much lower than the boiling temperature of the MOCVD precursor, low flow conductance would raise the pressure of the vaporizer, leading to the re-condensation of the liquid precursor. Low thermal conductance also would not supply enough thermal energy, again leading to the presence of cold spots, and the re-condensation of the liquid precursor.

Figure 4:
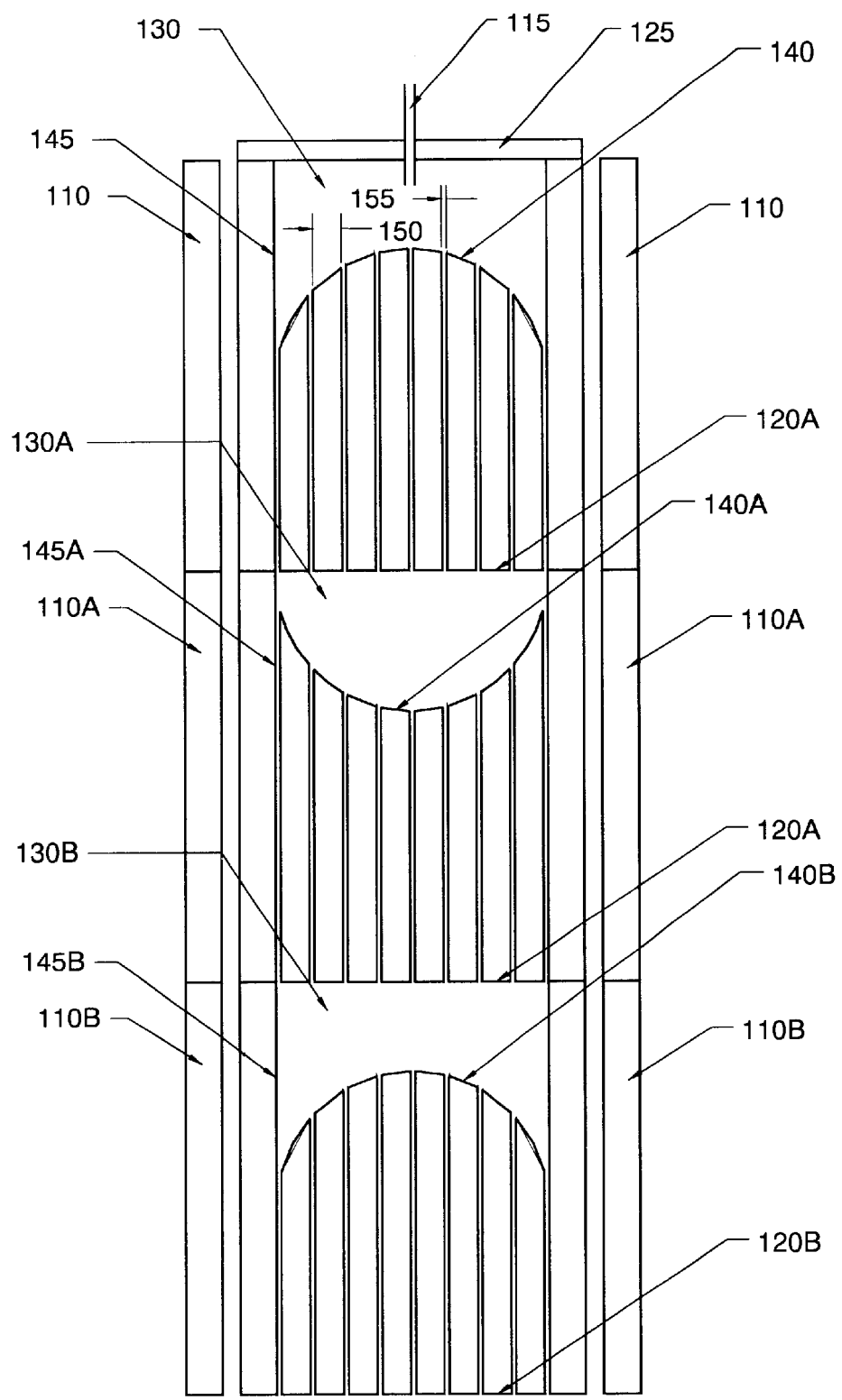
FIG. 4 shows the present invention vaporizer with multiple solid blocks.

FIG. 4 shows another aspect of the present invention vaporizer. The vaporizer includes multiple solid blocks operatively connected to each other to extend the length of the through holes for better heat transfer to the liquid precursor. The top surfaces of the successive blocks alternate between convex and concave for better liquid precursor distribution.

Figure 5:
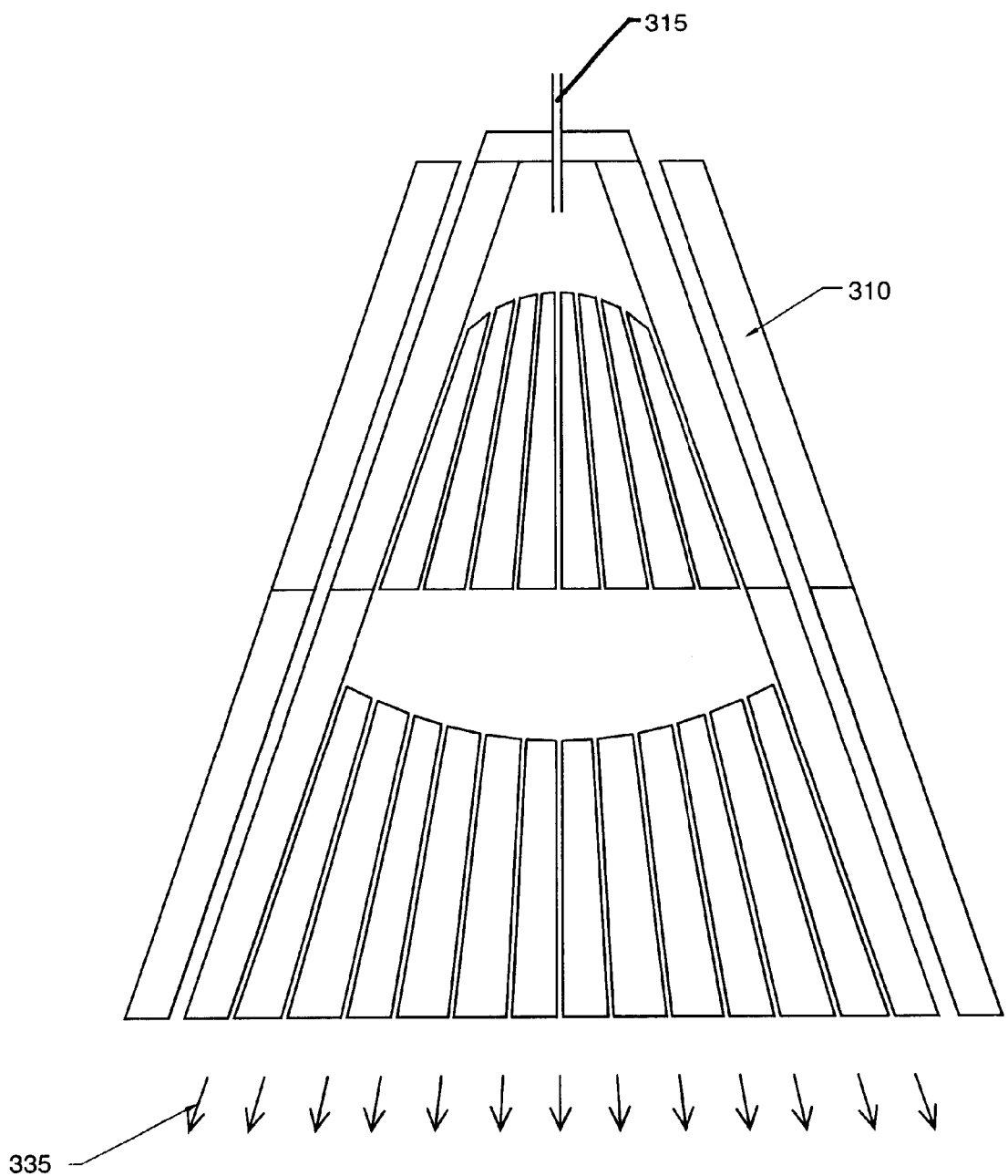
FIG. 5 shows the present invention vaporizer having cone shape.

FIG. 5 shows another aspect of the present invention vaporizer. The solid block has a cone shape to distribute the precursor to a greater area. The precursor enters the small liquid inlet 315 and distributes precursor vapor over a much larger area 335. In this way the vaporizer functions as a showerhead.

What is claimed is:

1. A vaporizer for vaporizing sensitive liquid precursors in semiconductor processing applications, the vaporizer comprising:

a solid block of good thermal conductance material for efficient heat transfer, the solid block having a top surface, a bottom surface and a side surface with a plurality of through holes going from the top surface to the bottom surface;

the through hole diameter being larger than 1/64 of an inch for preventing clogging due to the decomposition of the precursor;

the through hole separation being farther than 1/8 of an inch for allowing sufficient heat transfer to the through hole walls;

the top surface of the solid block is recessed inward leaving a thick wall at the side surface of the solid block to form a cavity, the recessed top surface of the cavity being convex toward the liquid precursor inlet to allow the liquid precursor to drip toward the side wall of the cavity for a more uniform distribution of the vaporized liquid precursor;

a cap plate to cap the cavity;

a plurality of input ports;

a heater means for heating the solid block from the side surface;

whereby the liquid precursor enters through the input ports to the cavity and travels through the through holes while receiving heat by contacting with the through hole walls, and the vaporized liquid precursor exits at the ends of the through holes at the bottom surface of the solid block.

2. A system as in claim 1 in which the input port accepts the emulsified liquid precursor.

3. A system as in claim 1 further comprising an atomizer for atomizing the liquid precursor before vaporizing.

4. A system as in claim 3 in which the atomizer is an ultrasonic atomizer.

5. A system as in claim 1 in which the input ports comprises a plurality of carrier gas inlets.

6. A system as in claim 1 in which the input ports comprises a plurality of liquid precursor inlets and in which the recessed top surface of the cavity being convex toward each liquid precursor inlet.

7. A system as in claim 1 further comprising:

a showerhead operatively connected to the ends of all through holes, the showerhead having an output to uniformly distribute the vaporized precursor over a substrate surface on which a deposited film is to be formed.

8. A system as in claim 1 in which the cavity size is larger than 1 inch.

9. A system as in claim 1 further comprising multiple solid blocks operatively connected to each other to extend the length of the through holes for better heat transfer to the liquid precursor.

10. A system as in claim 9 in which the top surfaces of the cavity of the successive solid blocks are alternate between convex and concave for more uniform precursor distribution.

11. A system as in claim 1 in which the through holes are at an angle so that the solid block is optical dense when looking from the top surface toward the bottom surface.

12. A system as in claim 1 in which the solid block has a cylinder shape, whereby the area covered by the through holes distribution are the same at the top surface and at the bottom surface of the solid block.

13. A system as in claim 1 in which the solid block has a cone shape, whereby the area covered by the through holes distribution are the larger at the bottom surface than at the top surface of the solid block.

14. A system as in claim 9 in which the solid blocks have a cone shape and each successive block is larger than the previous one, whereby the precursor distribution covers a much larger area.

15. A system as in claim 14 in which the last block is large enough to cover the whole area of the workpiece, eliminating the need for a showerhead distribution.

16. A system as in claim 1 further comprising a precursor delivery emulsifier to mix a gas with a liquid in a ratio greater, or equal to, one to one.

17. A system as in claim 16 further comprising:

a temperature means to adjust the temperature of the emulsifier, whereby the mixing process is conditioned for maximum control.

18. A system as in claim 17 in which the vaporization chamber is heated to a first temperature, and in which the emulsifier is heated to a second temperature less than the first temperature, whereby the second temperature is low enough to prevent clogging.

* * * * *